(12) United States Patent
Sakata et al.

(10) Patent No.: US 8,245,170 B2
(45) Date of Patent: Aug. 14, 2012

(54) TIMING LIBRARY TEST APPARATUS, METHOD FOR TESTING TIMING LIBRARY, AND COMPUTER READABLE MEDIUM COMPRISING TIMING LIBRARY TEST PROGRAM

(75) Inventors: Akio Sakata, Tokyo (JP); Shinsuke Sakamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 12/729,632

(22) Filed: Mar. 23, 2010

(65) Prior Publication Data
US 2011/0061036 A1 Mar. 10, 2011

(30) Foreign Application Priority Data
Sep. 7, 2009 (JP) .................................. 2009-205750

(51) Int. Cl.
*G06F 17/50* (2006.01)
(52) U.S. Cl. ....................................................... 716/113
(58) Field of Classification Search .................. 716/100, 716/113
See application file for complete search history.

(56) References Cited

U.S. PATENT DOCUMENTS
| 6,763,506 | B1 * | 7/2004 | Betz et al. | 716/108 |
| 7,657,855 | B1 * | 2/2010 | Manaker et al. | 716/113 |
| 2009/0055780 | A1 * | 2/2009 | Acar et al. | 716/2 |

FOREIGN PATENT DOCUMENTS
JP 09-305650 11/1997

OTHER PUBLICATIONS

Background Art Information sheet in one page.
Synopsys, Inc. "Trend Analysis for Single Characterization Tables" Library checking application note. Synopsys, Inc. 2009, p. 25-27.
Library Checking Application Note, Version C-2009.06, Synopsys Inc, Aug. 2009, pp. 25-27.

* cited by examiner

*Primary Examiner* — Suchin Parihar
(74) *Attorney, Agent, or Firm* — Knobbe, Martens, Olson & Bear LLP

(57) ABSTRACT

A timing library test apparatus includes a difference calculator looks into a look-up table in a timing library, the look-up table having timing constraint values registered in association with combinations between reference transient times of a signal at a reference terminal and constraint transient times of a signal at a constraint terminal, and groups neighboring two timing constraint values in the look-up table as one pair, respectively, to calculate differences between neighboring two timing constraint values of pairs, a determination part determines whether the differences calculated by the difference calculator has a characteristic feature of increase inclination or decrease inclination, and a decision part decides that the timing library has a singular point when the determination part determines that the differences doesn't have the characteristic feature, and to decide that the timing library doesn't have the singular point when the determination part determines that the differences has the characteristic feature.

20 Claims, 5 Drawing Sheets

TIMING LIBRARY TEST APPARATUS, METHOD FOR TESTING TIMING LIBRARY, AND COMPUTER READABLE MEDIUM COMPRISING TIMING LIBRARY TEST PROGRAM

CROSS REFERENCE TO RELATED APPLICATION

This application is based upon and claims the benefit of priority from the prior Japanese Patent Application No. 2009-205750, filed on Sep. 7, 2009, the entire contents of which are incorporated herein by reference.

BACKGROUND OF THE INVENTION

1. Field of the Invention

The present invention relates to a timing library test apparatus, a method for testing a timing library, and a computer readable medium comprising a timing library test program, and more particularly, to a timing library test apparatus, a method for testing a timing library, and a computer readable medium comprising a timing library test program that are used for verifying the timing library of a semiconductor integrated circuit.

2. Related Art

To create a timing library (such as a timing library for input timings of a sequential circuit) of an ordinary semiconductor integrated circuit, the input timings of the sequential circuit are measured in the vicinity of a meta-stable area in which the semiconductor integrated circuit operates in a very unstable manner. In this meta-stable area, it is difficult to obtain a stable output waveform. The output waveform tends to have an insufficient transition accompanied by oscillations or a hazard. This becomes even more prominent particularly where the source voltage of the semiconductor integrated circuit becomes lower.

However, in creating the timing library, even if the output waveform has the insufficient transition, it is determined that the semiconductor integrated circuit correctly operates as long as the output waveform is higher than a reference voltage that is a logical threshold value. In such a case, a logic gate having this output waveform cannot correctly operate if the output waveform is input. Therefore, even if the output waveform is higher than the reference voltage, it should be determined that the semiconductor integrated circuit can not correctly operate. However, in practice, it is determined that the semiconductor integrated circuit can correctly operate, and the timing of an input waveform at that point is registered as a hold time or a setup time in the timing library. Since the semiconductor integrated circuit can not correctly operate in accordance with the registered hold time or setup time, the registered hold time or setup time is a singular point in the timing library. As a result, a user cannot read accurate input timings from the timing library including the singular point. In this manner, in the conventional creation of the timing library, an incomplete timing library might be formed.

Furthermore, after the timing library is created, it is required that the user tests whether the timing library is incomplete (that is, whether the timing library includes the singular point) in a visual test.

However, such a visual test is very difficult, since enormous amounts of data are registered in the timing library. Therefore, if the user overlooks the singular point in the visual test, the user would verify the input timings of the sequential circuit with the use of the incomplete timing library. As a result, although the input timings of the sequential circuit have a failure, such a failure is overlooked. Thereby, a malfunction of the semiconductor integrated circuit, and increases in circuit size and power consumption due to an additional timing adjustment circuit for setting excess constraints (hereinafter referred to as "timing constraints") on the input timings of cells in the semiconductor integrated circuit are caused.

Although various solutions to problems in the creation of the timing library have been suggested (see JP-A No. 09-305650 (Kokai)), no solutions to these problems (the malfunction of the semiconductor integrated circuit and the increases in circuit size and power consumption) have been suggested.

SUMMARY OF THE INVENTION

According to a first aspect of the present invention, there is provided a timing library test apparatus comprising:

a difference calculator configured to look into a look-up table in a timing library, the look-up table having a plurality of timing constraint values registered in association with a plurality of combinations between reference transient times of a signal at a reference terminal and constraint transient times of a signal at a constraint terminal, and to group neighboring two timing constraint values in the look-up table as one pair, respectively, to calculate differences between neighboring two timing constraint values of a plurality of pairs;

a determination part configured to determine whether the differences calculated by the difference calculator has a characteristic feature of increase inclination or decrease inclination; and a decision part configured to decide that the timing library has a singular point when the determination part determines that the differences does not have the characteristic feature, and to decide that the timing library does not have the singular point when the determination part determines that the differences has the characteristic feature.

According to a second aspect of the present invention, there is provided a method for testing a timing library, the method comprising:

looking into a look-up table in a timing library, the look-up table comprising a plurality of timing constraint values registered in association with a plurality of combinations between reference transient times of a signal at a reference terminal and constraint transient times of a signal at a constraint terminal, grouping neighboring two timing constraint values in the look-up table as one pair, respectively, to calculate differences between neighboring two timing constraint values of a plurality of pairs;

determining whether the differences calculated by the difference calculator has a characteristic feature of increase inclination or decrease inclination; and deciding that the timing library has a singular point when it is determined that the differences does not have the characteristic feature, and that the timing library does not have the singular point when it is determined that the differences has the characteristic feature.

According to a third aspect of the present invention, there is provided a computer readable medium comprising a timing library test program comprising:

looking into a look-up table in a timing library, the look-up table comprising a plurality of timing constraint values registered in association with a plurality of combinations between reference transient times of a signal at a reference terminal and constraint transient times of a signal at a constraint terminal, grouping neighboring two timing constraint values in the look-up table as one pair, respectively, to calculate differences between neighboring two timing constraint values of a plurality of pairs;

determining whether the differences calculated by the difference calculator has a characteristic feature of increase inclination or decrease inclination; and deciding that the timing library has a singular point when it is determined that the differences does not have the characteristic feature, and that the timing library does not have the singular point when it is determined that the differences has the characteristic feature.

DETAILED DESCRIPTION OF THE INVENTION

An embodiment will now be explained with reference to the accompanying drawings.

Figure 1:
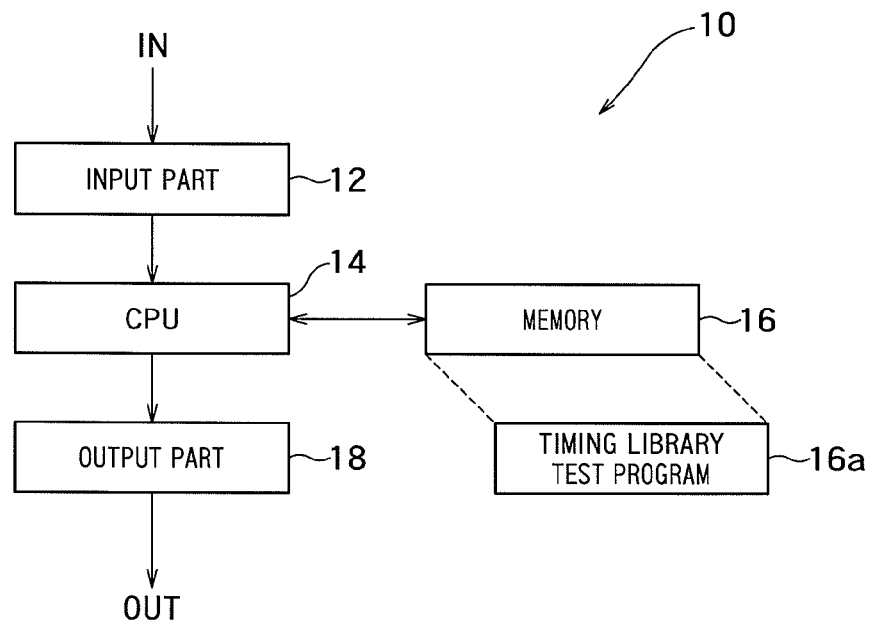
FIG. 1 is a block diagram illustrating a configuration of a timing library test apparatus 10 according to an embodiment.
Figure 2A:
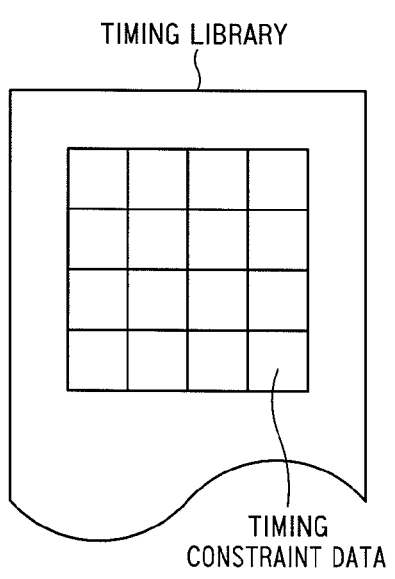
FIG. 2A is a schematic view showing a data structure of a timing library.
Figure 2B:
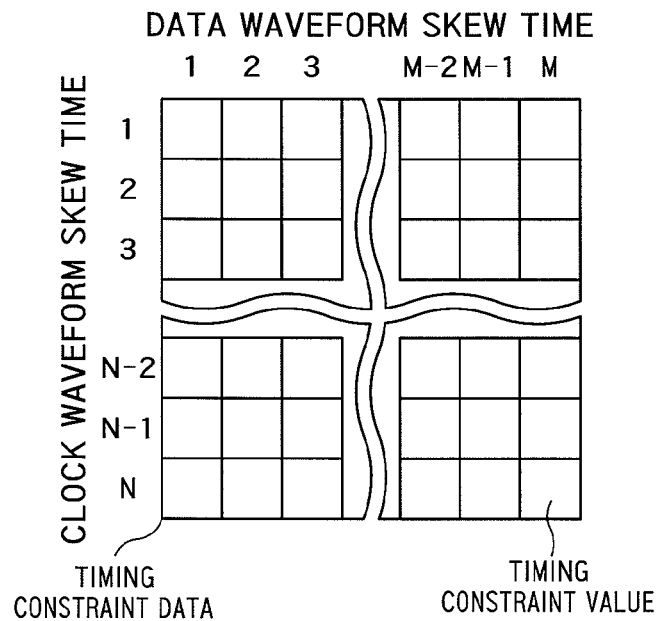
FIG. 2B is a schematic view showing a data structure of timing constraint data.
Figure 3:
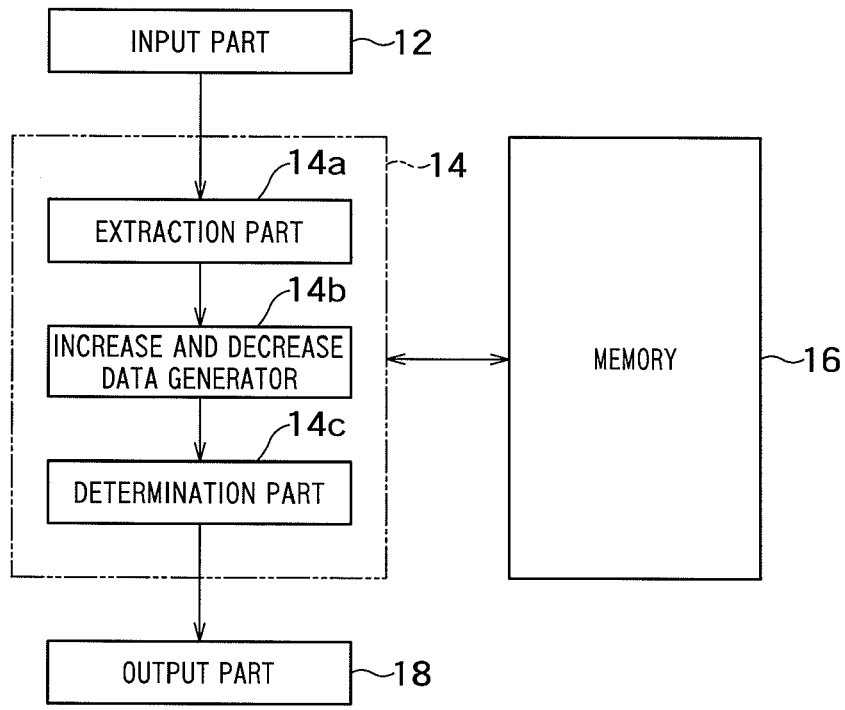
FIG. 3 is a block diagram showing functions realized by a CPU 14 of FIG. 1.
Figure 4:
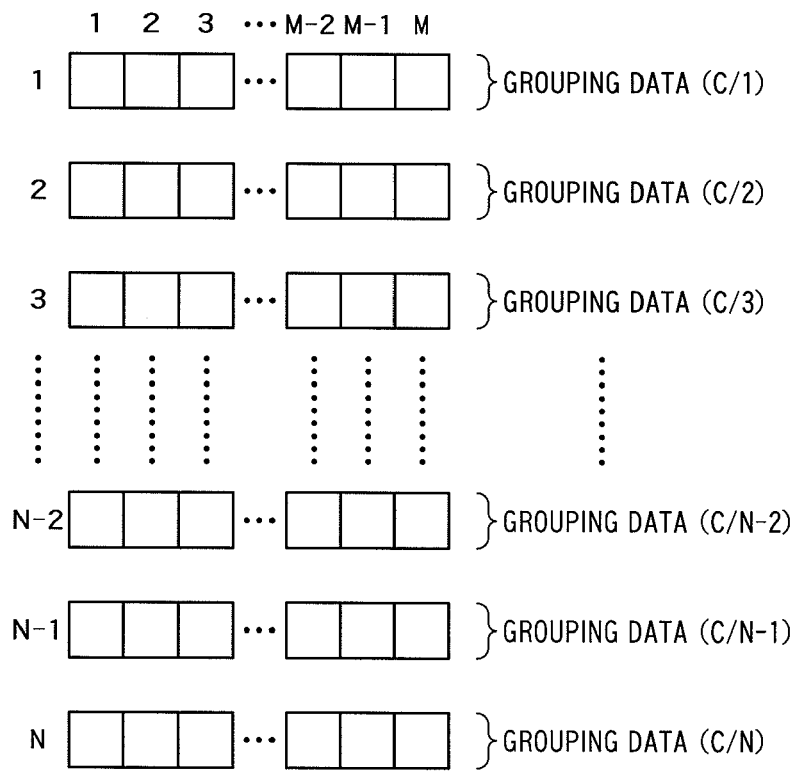
FIG. 4 is a schematic view showing grouping data of data waveform skews with respect to clock waveform skews.
Figure 5:
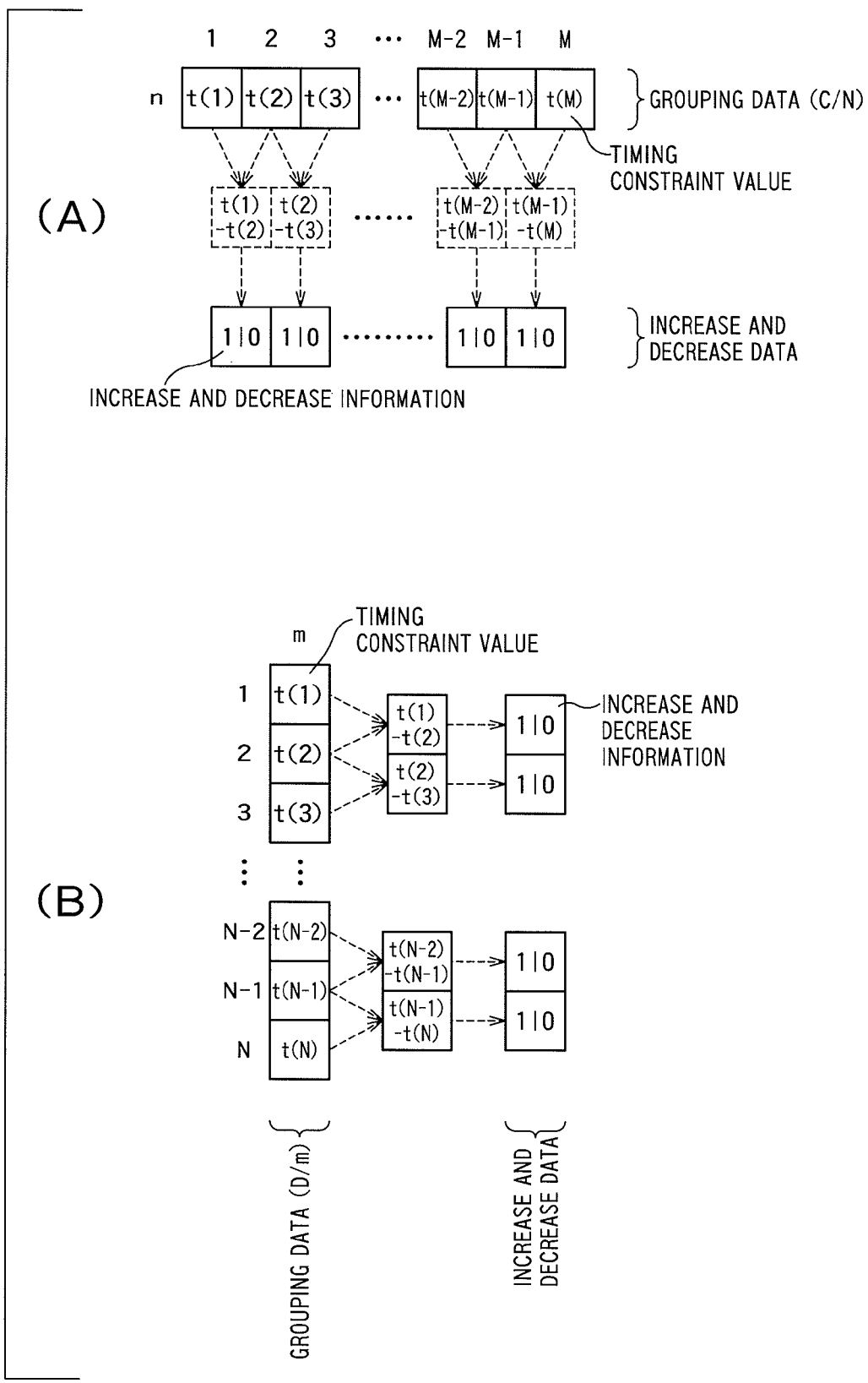
FIG. 5 is a schematic view showing an operation of an increase and decrease data generator 14b of FIG. 3.
Figure 6:
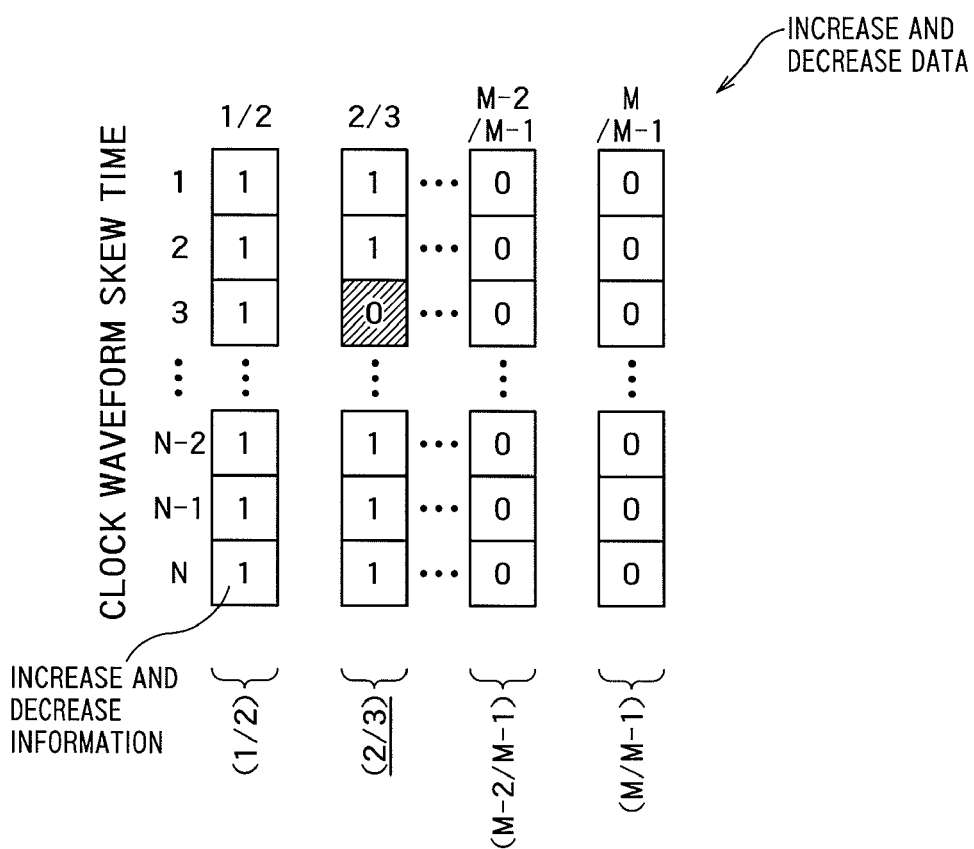
FIG. 6 is a schematic view showing a data structure of increase and decrease data with respect to the grouping data of data waveform skews.
Figure 7:
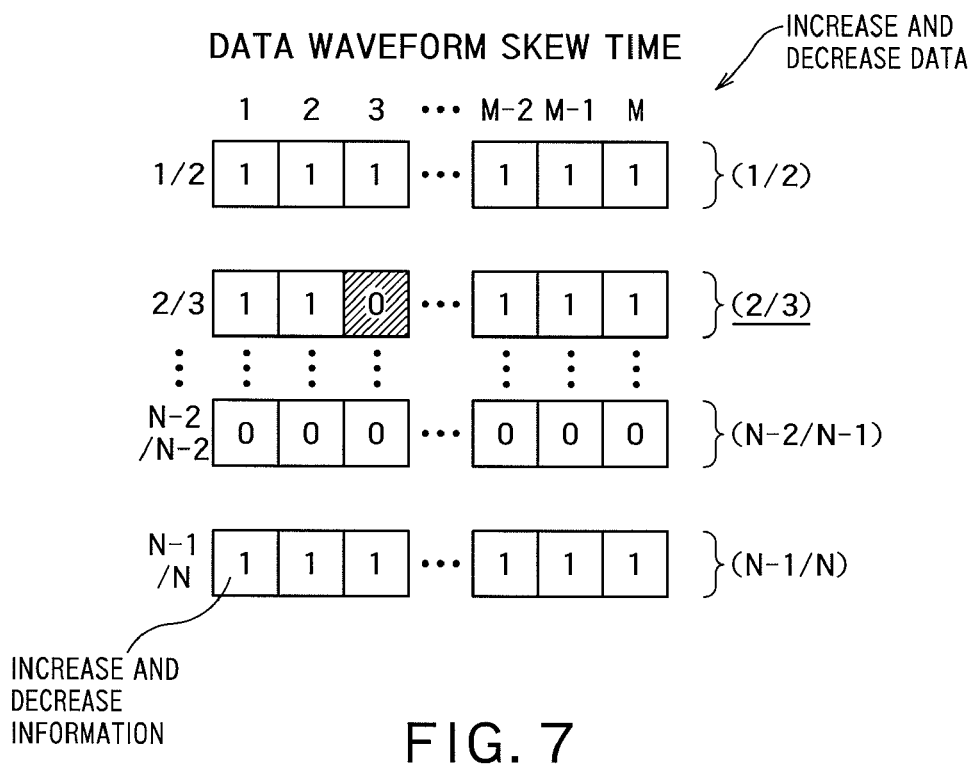
FIG. 7 is a schematic view showing the data structure of the increase and decrease data with respect to the grouping data of clock waveform skews.

A configuration of a timing library test apparatus according to the embodiment will now be explained. FIG. 1 is a block diagram illustrating a configuration of a timing library test apparatus 10 according to an embodiment. FIG. 2A is a schematic view showing a data structure of a timing library. FIG. 2B is a schematic view showing a data structure of timing constraint data. FIG. 3 is a block diagram showing functions realized by a CPU 14 of FIG. 1. FIG. 4 is a schematic view showing grouping data of data waveform skews with respect to clock waveform skews. FIG. 5 is a schematic view showing an operation of an increase and decrease data generator 14b of FIG. 3. FIG. 6 is a schematic view showing a data structure of increase and decrease data with respect to the grouping data of data waveform skews. FIG. 7 is a schematic view showing the data structure of the increase and decrease data with respect to the grouping data of clock waveform skews.

As shown in FIG. 1, the timing library test apparatus 10 according to the embodiment includes an input part 12, a processor (hereinafter referred to as "CPU (Central Processing Unit)") 14, a memory 16, and an output part 18. The input part 12, the memory 16, and the output part 18 are connected to the CPU 14.

The input part 12 of FIG. 1 is configured to receive a timing library including timing restraint values of a semiconductor integrated circuit. For example, the input part 12 is configured to receive the timing library that is fed by a user through an input device such as a keyboard. As shown in FIG. 2A, the timing library includes sets of timing constraint data. As shown in FIG. 2B, each of sets of the timing constraint data is a table that includes timing constraint values having N clock waveform skew times and M data waveform skew times as indices. In other words, each of sets of the timing constraint data includes the timing constraint values in each of terminals (hereinafter referred to as "reference terminals"), which serves as a reference for the timing constraints of the semiconductor integrated circuit, corresponding to terminals (hereinafter referred to as "constraint terminals") in which timings are constrained. Each of sets of the timing constraint data is shown as a look-up table including the waveform skews of the reference terminals and the waveform skews of the constraint terminals. That is, the look-up table has a plurality of timing constraint values registered in association with a plurality of combinations between reference transient times of a signal at a reference terminal and constraint transient times of a signal at a constraint terminal. The timing constraint values are information regarding the timing constraints on input timings of cells in the semiconductor integrated circuit. More specifically, the timing constraint values are the information that indicates the timing constraints set for synchronous operations defined between a clock terminal and a data terminal or between two data terminals. In other words, the timing constraint values indicate the constraints on the time difference between a signal reaching an input terminal (the clock terminal or the data terminal) in a cell and a signal reaching the data terminal.

The CPU 14 of FIG. 1 is configured to start a timing library test program 16a stored in the memory 16, to realize an extraction part 14a, an increase and decrease data generator 14b, and a determination part 14c of FIG. 3.

The extraction part 14a of FIG. 3 is configured to extract the timing constraint data of FIG. 2B from the timing library received by the input part 12. For example, where the clock terminal is the reference terminal while the data terminal is the constraint terminal, the extraction part 14a extracts grouping data (C/n) of the data waveform skews with respect to the clock waveform skews of FIG. 4.

The increase and decrease data generator 14b of FIG. 3 is configured to calculate the difference between two neighboring timing constraint values in the timing constraint data extracted by the extraction part 14a, generate increase and decrease data indicating an increase or decrease of the timing constraint value from the calculated difference, and write the generated increase and decrease data into the memory 16. Alternatively, the increase and decrease data generator 14b may calculate the difference between two timing constraint values of two neighboring constraint terminals with respect to one reference terminal, and generate the increase and decrease data indicating an increase or decrease of timing constraint value from the calculated differences. Also, the increase and decrease data generator 14b may calculate the differences between two timing constraint values of two neighboring reference terminals with respect to one constraint terminal, and generate the increase and decrease data indicating an increase or decrease of timing constraint value from the calculated differences. For example, as shown in (A) of FIG. 5, the increase and decrease data generator 14b calculates the difference between two timing constraint values (t(m)) (m: 1 to M) of the two neighboring terminals in the ascending order of the indices n (n: 1 to N) of the data waveform skews in the grouping data (C/n) of the data waveform skews, and generates the increase and decrease data formed with sets of 2-bits data (1|0) indicating the amount of each of the two neighboring timing constraint values with respect to each other (see FIG. 6). Also, as shown in (B) of FIG. 5, the increase and decrease generator 14b calculates the difference between two neighboring timing constraint values (t(n)) of the two neighboring terminals in the ascending order of the indices m of the data waveform skews in the grouping data (D/m) of clock waveform skews, and generates the increase and decrease data formed with sets of 2-bits data indicating the amount of each of the two neighboring timing constraint values with respect to each other (see FIG. 7). In FIG. 6, the increase and decrease data (m/m−1) includes "t(m)-t(m−1)" pieces of increase and decrease information. In FIG. 7, the increase and decrease data (n/n−1) includes "t(n)-t(n−1)" pieces of increase and decrease information. The increase and decrease generator 14b generates the increase and decrease data for the grouping data of data waveform skews corresponding to all the indices of clock waveform skews. In FIGS. 6 and 7, "1" indicates that the calculation result is negative (that is, the timing constraint value becomes larger as the data waveform skew increases), and "0" indicates that the calculation result is 0 or greater (that is, the timing constraint value is constant or decreases as the data waveform skew increases). That is, the increase and decrease data generator 14b includes a difference calculator. The difference calculator is configured to look into the look-up table in the timing library, and to group neighboring two timing constraint values in the look-up table as one pair, respectively, to calculate differences between neighboring two timing constraint values of a plurality of pairs.

The determination part 14c of FIG. 3 is configured to determine whether the increase and decrease data generated by the increase and decrease data generator 14b includes both a value indicating an increase and a value indicating a decrease. For example, in the increase and decrease data of FIG. 6, the increase and decrease data (1/2) includes only "1" (increase) indicating that the timing constraint values increases. The increase and decrease data (M−2/M−1) and (M−1/M) includes only "0" (decrease) indicating that the timing constraint value is constant or decreases. The increase and decrease data (2/3) includes both "1" (increase) and "0" (decrease). In this case, the determination part 14c determines that a singular point is included between the grouping data (C/2) and the grouping data (C/3). In the increase and decrease data of FIG. 7, the increase and decrease data (1/2) and the increase and decrease data (N−1/N) include only "1" (increase) indicating that the timing constraint value increases. The increase and decrease data (N−2/N−1) includes only "0" (decrease) indicating that the timing constrains is constant or decreases. The increase and decrease data (2/3) includes both "1" (increase) and "0" (decrease). In this case, the determination part 14c determines that the singular point is included between the grouping data (D/2) and the grouping data (D/3). In other words, the determination part 14c determines that the singular point is included in the timing library when the grouping data of data waveforms with respect to the same clock waveform skew and the grouping data of clock waveforms with respect to the same data waveform skew include at least one increase and decrease data having different increasing or decreasing orientation. The determination on the increase and decrease data of FIG. 6 and the determination on the increase and decrease data of FIG. 7 may be performed in random order. That is, the determination part 14c is configured to determine whether the differences calculated by the difference calculator has a characteristic feature of increase inclination or decrease inclination. In the other words, the determination part 14c is configured to determine whether the increase and decrease data includes only one kind of value. When the increase and decrease data includes only one kind of value ("1" or "0"), it is determined that the differences has the characteristic feature. When the increase and decrease data includes two kinds of value ("1" and "0"), it is determined that the differences does not have the characteristic feature.

The memory 16 of FIG. 1 is capable of storing various kinds of data to be used in a timing library test operation. The memory 16 also stores the timing library test program 16a for realizing the functions of FIG. 3. The timing library test program 16a includes an input code, an extraction code, an increase and decrease data generation code, a determination code, and an output code. The input code is configured to receive data received by the input part 12 of FIG. 1. The extraction code is configured to realize the extraction part 14a of FIG. 3. The increase and decrease data generation code is configured to realize the increase and decrease data generator 14b of FIG. 3. The determination code is configured to realize the determination part 14c of FIG. 3. The output code is configured to output data from the output part 18 of FIG. 1. For example, the memory 16 is a computer-readable medium such as a hard disk device.

The output part 18 of FIG. 1 is configured to report that the timing library includes the singular point when the determination part 14c determines that the increase and decrease data includes both the value indicating the increase and the value indicating the decrease. For example, when the determination part 14c determines that the increase and decrease data includes both the value indicating the increase and the value indicating the decrease (that is, the singular point is included in the timing library), the output part 18 outputs a message indicating that the singular point is included in the timing library, identification information identifying the timing constraint data including the singular point, and the timing constraint data including the singular point. The identification information includes at least one of the following items: a cell name of the cell corresponding to the timing constraint values, a terminal name of the terminal having the timing constraint set thereon, and a setting condition of the terminal in the same cell as the terminal having the timing constraint set thereon. The output part 18 transmits the output data to a display or a printer, or transmits the output data to a server via a network. In other words, when the determination part 14c determines that the singular point is included in the timing library, the output part 18 outputs the information indicating that the timing constraint data is incomplete. That is, the output part 18 includes a decision part. The decision part is configured to decide that the timing library has the singular point when the determination part 14c determines that the differences does not have the characteristic feature, and to decide that the timing library does not have the singular point when the determination part 14c determines that the differences has the characteristic feature.

Figure 8:
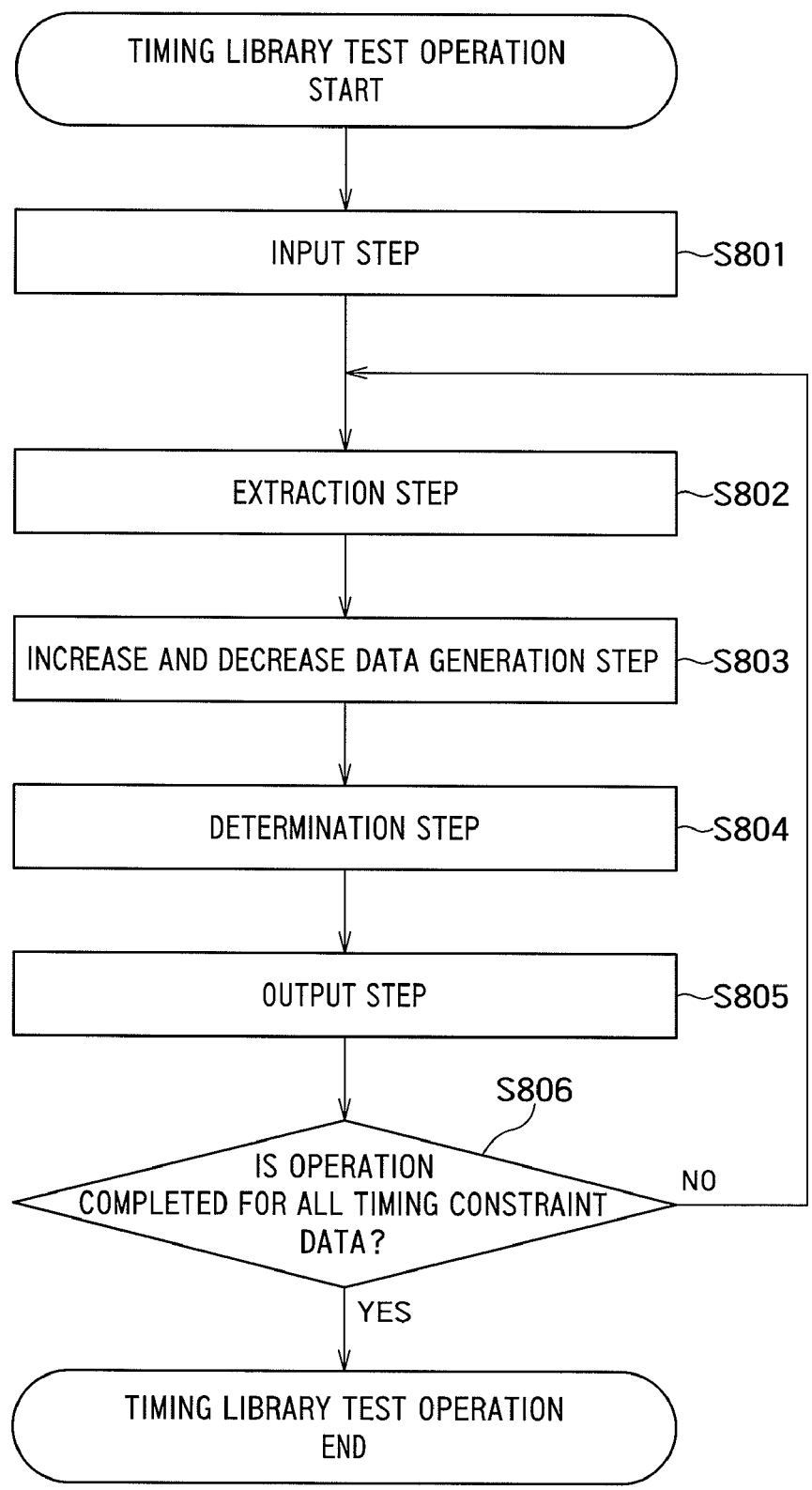
FIG. 8 is a flowchart showing procedures in a timing library test operation according to the embodiment of the present invention.

A timing library test operation according to the embodiment will now be explained. FIG. 8 is a flowchart showing procedures in a timing library test operation according to the embodiment of the present invention.

<FIG. 8: Input Step (S801)> The input part 12 receives the timing library (see FIG. 2A) that is input by the user. If the timing library is stored beforehand in the memory 16, the input part 12 reads out the timing library from the memory 16.

<FIG. 8: Extraction Step (S802)> The extraction part 14a extracts the timing constraint data including the timing constraint values (see FIG. 2B) from the timing library received in the input step (S801).

<FIG. 8: Increase and Decrease Data Generation Step (S803)> The increase and decrease data generation part 14b generates the increase and decrease data (see FIGS. 6 and 7)

with respect to the timing constraint data extracted in the extraction step (S802), and writes the generated increase and decrease data into the memory 16. The increase and decrease data generation step (S803) is carried out for all the grouping data (see FIG. 4) included in the timing constraint data. That is, in the increase and decrease data generation step (S803), the differences between neighboring two timing constraint values of the plurality of pairs are calculated.

<FIG. 8: Determination Step (S804)> The determination part 14c determines whether the increase and decrease data generated in the increase and decrease data generation step (S803) includes both the value indicating the increase and the value indicating the decrease (that is, whether the increase and decrease data includes the singular point). The determination step (S804) is carried out for all the grouping data included in the increase and decrease data. That is, in the determination step (S804), whether the differences calculated by the difference calculator has the characteristic feature of increase inclination or decrease inclination is determined.

<FIG. 8: Output Step (S805)> The output part 18 reports that the timing library includes the singular point when it is determined that the increase and decrease data includes both the value indicating the increase and the value indicating the decrease in the determination step (S804). It is decided that the timing library has the singular point when the determination part 14c determines that the differences does not have the characteristic feature. It is decided that the timing library does not have the singular point when the determination part 14c determines that the differences has the characteristic feature.

<FIG. 8: S806> Steps starting from the extraction step (S802) through the output step (S805) are repeatedly carried out on all the timing constraint data included in the timing library (S806: NO). When the steps starting from the extraction step (S802) through the output step (S805) are completed on all the timing constraint data included in the timing library (S806: YES), the timing library test operation according to the embodiment ends.

In a modification of the embodiment, the increase and decrease data generator 14b may generate only either the increase and decrease data of FIG. 6 or the increase and decrease data of FIG. 7. In such a case, the determination part 14c carries out the determination step (S804) on either the increase and decrease data of FIG. 6 or the increase and decrease data of FIG. 7.

The timing library test apparatus 10 according to the embodiment includes the difference calculator, the determination part 14c, and the decision part. The difference calculator is configured to look into the look-up table in the timing library, the look-up table having the plurality of timing constraint values registered in association with the plurality of combinations between reference transient times of the signal at the reference terminal and constraint transient times of the signal at the constraint terminal, and to group neighboring two timing constraint values in the look-up table as one pair, respectively, to calculate differences between neighboring two timing constraint values of the plurality of pairs. The determination part 14c is configured to determine whether the differences calculated by the difference calculator has the characteristic feature of increase inclination or decrease inclination. The decision part is configured to decide that the timing library has the singular point when the determination part 14c determines that the differences does not have the characteristic feature, and to decide that the timing library does not have the singular point when the determination part 14c determines that the differences has the characteristic feature. In other words, it is determined whether the timing constraint data in the timing library includes the singular point, based on the increase and decrease data. When the singular point is included in the timing library, a notification indicating that the singular point is included in the timing library is reported. Accordingly, it is possible to prevent a malfunction of the semiconductor integrated circuit due to an overlooked timing error, and increases in circuit size and power consumption due to an additional timing adjustment circuit for setting excess timing constraints.

According to the embodiment, the differences in timing constraint values between two neighboring constraint terminals with respect to the reference terminal or the differences in timing constraint values between two neighboring reference terminals with respect to the constraint terminal is calculated. Then, the increase and decrease data indicating the increases or decreases in the timing constraint values is generated based on the calculated differences. In other words, the differences of at least two pairs are calculated at least one of one reference transient time and one constraint delay time. With this arrangement, a level of abstraction becomes higher, thereby, a processing speed can be improved.

According to the embodiment, it is determined whether the timing constraint data includes the singular point, with respect to both the reference terminal and the constraint terminal. With this arrangement, an accuracy of the timing library test operation can be made higher.

According to the embodiment, the increase and decrease data (that is, determined result of the determination part 14c) is stored in the memory 16. With this arrangement, the processing speed in the timing library test operation can be improved.

According to the embodiment, when the increase and decrease data includes both the value indicating the increase and the value indicating the decrease (that is, it is determined that the differences does not have the characteristic feature), the message indicating that the timing library includes the singular point is output. With this arrangement, the user can readily determine whether the singular point is included in the timing library.

According to the embodiment, the identification information identifying that the timing constraint data including the singular point is output (at least one of the cell name, the terminal name, and the setting condition). With this arrangement, the user can readily identify the location of the singular point, and can visually analyze the location of the singular point.

According to the embodiment, the timing constraint data including (look-up table) the singular point is output. With this arrangement, the user can readily check a pseudo error. Furthermore, when the user check whether the pseudo error is an intrinsic error, the intrinsic error in the timing library can be readily corrected.

At least a portion of timing library test apparatus 10 according to the above-described embodiments of the present invention may be composed of hardware or software. When at least a portion of the timing library test apparatus 10 is composed of software, a program for executing at least some functions of the timing library test apparatus 10 may be stored in a recording medium, such as a flexible disk or a CD-ROM, and a computer may read and execute the program. The recording medium is not limited to a removable recording medium, such as a magnetic disk or an optical disk, but it may be a fixed recording medium, such as a hard disk or a memory.

In addition, the program for executing at least some functions of the timing library test apparatus 10 according to the above-described embodiment of the present invention may be distributed through a communication line (which includes wireless communication) such as the Internet. In addition, the program may be encoded, modulated, or compressed and then distributed by wired communication or wireless communication such as the Internet. Alternatively, the program may be stored in a recording medium, and the recording medium having the program stored therein may be distributed.

The above-described embodiments of the present invention are just illustrative, but the invention is not limited thereto. The technical scope of the invention is defined by the appended claims, and various changes and modifications of the invention can be made within the scope and meaning equivalent to the claims.

What is claimed is:

1. A timing library test apparatus comprising:
a difference calculator configured to look into a look-up table in a timing library, the look-up table comprising a plurality of timing constraint values registered in association with a plurality of combinations between reference transient times of a signal at a reference terminal and constraint transient times of a signal at a constraint terminal, and to group neighboring two timing constraint values in the look-up table as one pair, respectively, and to calculate differences between neighboring two timing constraint values of a plurality of pairs;
a determination part configured to determine whether the differences calculated by the difference calculator have a characteristic feature of increase inclination or decrease inclination; and
a decision part configured to decide that the timing library has a singular point when the determination part determines that the differences does not have the characteristic feature, and to decide that the timing library does not have the singular point when the determination part determines that the differences have the characteristic feature.

2. The apparatus of claim 1, wherein the difference calculator is further configured to calculate at least two differences of at least two pairs at one reference transient time.

3. The apparatus of claim 1, wherein the difference calculator is further configured to calculate at least two differences of at least two pairs at one constraint delay time.

4. The apparatus of claim 1, further comprising a memory configured to store data, wherein the determination part is further configured to write determined results into the memory.

5. The apparatus of claim 1, further comprising an output part configured to output a message indicating that the timing library comprises the singular point.

6. The apparatus of claim 1, further comprising an output part configured to output identification information identifying the look-up table comprising the singular point.

7. The apparatus of claim 6, wherein the identification information comprises at least one of a cell name of a cell corresponding to the timing constraint values, a terminal name of a terminal comprising the timing constraint set thereon, and a setting condition of a terminal in the same cell as the terminal comprising the timing constraint set thereon.

8. The apparatus of claim 1, further comprising an output part configured to output the look-up table.

9. A method of testing a timing library, the method comprising:
looking into a look-up table in a timing library, the look-up table comprising a plurality of timing constraint values registered in association with a plurality of combinations between reference transient times of a signal at a reference terminal and constraint transient times of a signal at a constraint terminal,
grouping neighboring two timing constraint values in the look-up table as one pair, respectively, and calculating differences between neighboring two timing constraint values of a plurality of pairs;
determining whether the differences calculated have a characteristic feature of increase inclination or decrease inclination; and
deciding that the timing library has a singular point when it is determined that the differences do not have the characteristic feature, and that the timing library does not have the singular point when it is determined that the differences have the characteristic feature,
wherein the method is implemented by a computer.

10. The method of claim 9, wherein calculating the differences comprises calculating at least two differences of at least two pairs at one reference transient time.

11. The method of claim 9, wherein calculating the differences comprises calculating at least two differences of at least two pairs at one constraint delay time.

12. The method of claim 9, wherein determining whether the differences calculated have the characteristic comprises storing determined results.

13. The method of claim 9, further comprising outputting a message indicating that the timing library comprises the singular point.

14. The method of claim 9, further comprising outputting identification information identifying the look-up table comprising the singular point.

15. The method of claim 14, wherein the identification information comprises at least one of a cell name of a cell corresponding to the timing constraint values, a terminal name of a terminal comprising the timing constraint set thereon, and a setting condition of a terminal in the same cell as the terminal comprising the timing constraint set thereon.

16. The method of claim 9, further comprising outputting the look-up table.

17. A computer readable non-transitory storage medium having stored thereon a timing library test program that when executed by the one or more processors, causes the one or more processors to:
look into a look-up table in a timing library, the look-up table comprising a plurality of timing constraint values registered in association with a plurality of combinations between reference transient times of a signal at a reference terminal and constraint transient times of a signal at a constraint terminal,
group neighboring two timing constraint values in the look-up table as one pair, respectively, and to calculate differences between neighboring two timing constraint values of a plurality of pairs;
determine whether the differences calculated by the difference calculator have a characteristic feature of increase inclination or decrease inclination; and
decide that the timing library has a singular point when it is determined that the differences do not have the characteristic feature, and that the timing library does not have the singular point when it is determined that the differences have the characteristic feature.

18. The medium of claim 17, wherein the timing library test program is additionally configured to cause the one or more processors to calculate at least two differences of at least two pairs at one reference transient time.

19. The medium of claim 17, wherein the timing library test program is additionally configured to cause the one or more processors to calculate at least two differences of at least two pairs at one constraint delay time.

20. The medium of claim 17, wherein in the timing library test program is additionally configured to cause the one or more processors to determine whether the differences have the characteristic feature comprises code capable of causing a processor to store determined results.

* * * * *